United States Patent [19]

Kimura

[11] Patent Number: 4,794,342
[45] Date of Patent: Dec. 27, 1988

[54] INTERMEDIATE FREQUENCY AMPLIFICATION CIRCUIT CAPABLE OF DETECTING A FIELD STRENGTH WITH LOW ELECTRIC POWER

[75] Inventor: Katsuji Kimura, Tokyo, Japan
[73] Assignee: NEC Corporation, Tokyo, Japan
[21] Appl. No.: 57,145
[22] Filed: Jun. 3, 1987

[30] Foreign Application Priority Data

Jun. 4, 1986 [JP] Japan .................................. 61-130802
Jun. 12, 1986 [JP] Japan .................................. 61-137415
Jun. 16, 1986 [JP] Japan .................................. 61-140511

[51] Int. Cl.$^4$ ............................................... H03F 3/45
[52] U.S. Cl. ........................................ 330/2; 330/252; 455/155
[58] Field of Search ..................... 330/2, 252; 455/154, 455/155, 211, 226, 229

[56] References Cited

U.S. PATENT DOCUMENTS 4,680,553 7/1987 Kimura et al. ........................... 330/2

Primary Examiner—James B. Mullins
Attorney, Agent, or Firm—Sughrue, Mion, Zinn, Macpeak & Seas

[57] ABSTRACT

In an intermediate frequency amplification circuit comprising first through n-th differential amplifiers which are connected in cascade to one another with the first amplifier supplied with a circuit input signal and which successively produce amplifier output signals with an n-th amplifier output signal produced as a circuit output signal from the n-th amplifier, first through (n+1)-th rectification circuits are supplied with respective amplifier output signals with the circuit input signal given to the first rectification circuit. Each rectification circuit comprises a differential unit comprising at least one pair of transistors which have different emitter areas from each other to rectify each amplifier output signal and to produce a collector current which is summed up by an adder circuit to be produced as a field strength signal. The rectification circuits may carry out either half-wave rectification or full-wave rectification. A plurality of the above-mentioned pairs may be included in each rectification circuit.

4 Claims, 12 Drawing Sheets

FIG 5

INTERMEDIATE FREQUENCY AMPLIFICATION CIRCUIT CAPABLE OF DETECTING A FIELD STRENGTH WITH LOW ELECTRIC POWER

BACKGROUND OF THE INVENTION

This invention relates to an intermediate frequency amplification circuit for use in a mobile radio station (unit), a cordless telephone set, and/or a telemeter system, and, more particularly, to an intermediate frequency amplification circuit which is capable of measuring or detecting a field strength.

A conventional intermediate frequency amplification circuit of the type described comprises an amplification part which is supplied with a circuit input signal to produce a circuit output signal subjected to amplification therein. In addition, a signal strength measuring part is included in the intermediate frequency amplification circuit to measure or detect a field strength of the circuit input signal.

More particularly, the amplification part of such an amplification circuit comprises a plurality of differential stages connected in cascade to one another. Each of the differential stages comprises a first pair of transistors having emitters coupled in common to each other. On the other hand, the signal strength measuring part measures the field strength by detecting a d.c. level of the circuit input signals. For this purpose, the signal strength measuring part comprises a plurality of rectification circuits for rectifying output signals of the differential stages to produce rectified signals, respectively, and capacitors coupled to the respective rectification circuits so as to add the rectified signals to one another. Each of the rectification circuits is implemented by a plurality of transistors to carry out half-wave rectification.

With this structure, each capacitance of the capacitors in the rectification circuits inevitably becomes large with a reduction of an intermediate frequency necessary in the intermediate frequency amplification circuit. On manufacturing such an intermediate frequency amplification circuit by the use of a semiconductor integration technique, necessity of a large capacitance gives rise to an increase of a chip size. In order to reduce a chip size, it might be considered that the respective capacitors are connected as external capacitors outside of a chip. However, use of the external capacitors results in an increase of terminals derived from the chip and makes it difficult to apply an integration technique to such an amplification circuit. At any rate, the above-mentioned amplification circuit requires the capacitors equal in number to the rectification circuits.

Moreover, each rectification circuit has a bad temperature characteristic. In order to improve the temperature characteristic, complicated compensation must be carried out in each rectification circuit.

In Unexamined Japanese Patent Publication No. Sho 60-246108, an intermediate frequency amplification circuit is disclosed which comprises first through last full-wave rectification circuits connected in cascade to one another. Each of the full-wave rectification circuits comprise first and second differential amplifiers and third and fourth differential amplifiers connected to the first and the second differential amplifiers in series across a power source, respectively. Each of the rectified output signals is sent through a current mirror circuit to a current summation circuit to produce a field strength signal. The current summation circuit may include a single capacitor.

Incidentally, the first differential amplifier of each full-wave rectification circuit serves to supply an amplified signal to a next following one of the full-wave rectification circuits. As a result, a circuit input signal is supplied to the first full-wave rectification circuits and subjected to amplification through each of the full-wave rectification circuits to produce a circuit output signal through the last full-wave rectification circuit.

With this structure, it is possible to improve a temperature characteristic and to produce the field strength signal by the use of a single capacitor.

However, the intermediate frequency amplification circuit is disadvantageous in that a source voltage must comparatively be high because the first and the second differential amplifiers must be connected to the third and the fourth differential amplifiers in series across the power source. In fact, it is difficult to drive the amplification circuit at a voltage lower than 2 volts or so. This shows that power consumption becomes large in the intermediate frequency amplification circuit.

SUMMARY OF THE INVENTION

It is an object of this invention to provide an intermediate frequency amplification circuit which can readily be manufactured by the use of a semiconductor integration technique even when an intermediate frequency is low.

It is another object of this invention to provide an intermediate frequency amplification circuit of the type described, which is stable in temperature characteristic.

It is still another object of this invention to provide an intermediate frequency amplification circuit of the type described, which can reduce power consumption in the circuit.

An intermediate frequency amplification circuit to which this invention is applicable is operable in response to a circuit input signal to produce a circuit output signal subjected to amplification. The intermediate frequency amplification circuit comprises first through n-th differential amplifiers which have first through n-th amplifier input terminal pairs and first through n-th amplifier output terminal pairs, respectively, and which are connected in cascade from the first to the n-th differential amplifiers by successively connecting the amplifier output terminal pair of each differential amplifier to the amplifier input terminal pair of the next following differential amplifier. The circuit input signal is supplied across the first amplifier input terminal pair while the circuit output signal is produced through the n-th amplifier output terminal pair. The intermediate frequency amplification circuit further comprises a measuring circuit responsive to the circuit input signal for measuring a field strength to produce a field strength signal representative of the field strength.

According to this invention, the measuring circuit comprises first through $(n+1)$-th differential units which have first through $(n+1)$-th unit input terminal pairs, respectively, the first through n-th unit input terminal pairs being connected to the first through n-th amplifier input terminal pairs, respectively, while the $(n+1)$-th unit input terminal pair is connected to the n-th amplifier output terminal pair, and first through $(n+1)$-th unit output terminal pairs are supplied with first through $(n+1)$-th unit output signals, respectively, and an adder circuit connected to the first through $(n+1)$-th unit output terminal pairs for adding the first through (n+1)-th unit output signals to one another to produce the field strength signal. Each of the first through (n+1)-th differential units comprises a primary differential circuit of first and second primary transistors which have first and second base regions, first and second emitter regions, and first and second collector regions, respectively. The first and the second base regions of the first through n-th differential units are connected to the first through n-th amplifier input terminal pairs respectively, while the first and the second base region of the (n+1)-th differential unit are connected to the n-th amplifier output pair. The first and the second emitter regions have an area ratio of 1:k, where k is greater than unity, and are coupled in common to each other. The first and the second collector regions are connected to the unit output terminal pair, respectively.

BRIEF DESCRIPTION OF THE DRAWINGS

FIG. 5 is a circuit diagram of an intermediate frequency amplification circuit according to a second embodiment of this invention;

DESCRIPTION OF THE PREFERRED EMBODIMENTS

Figure 1:
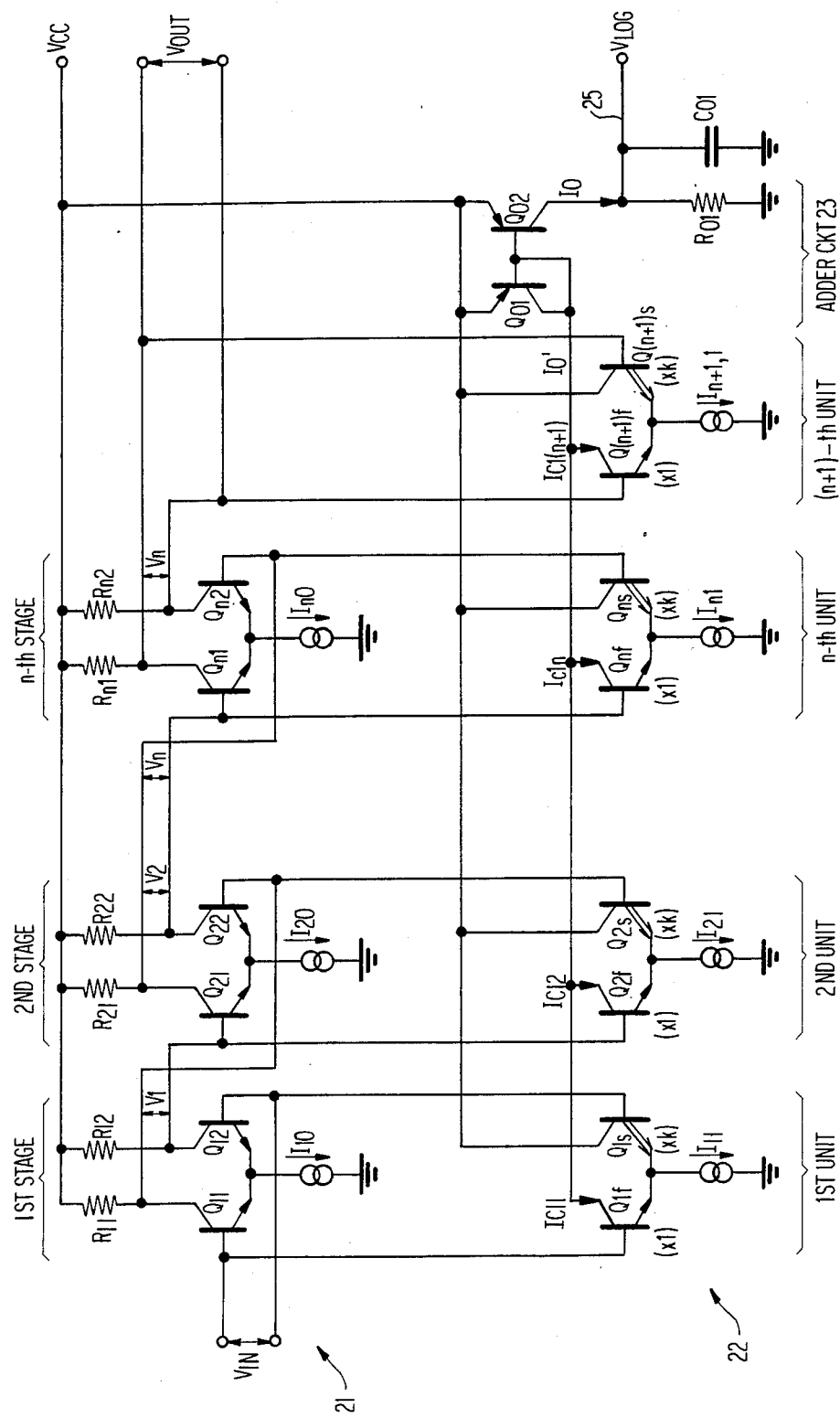
FIG. 1 is a circuit diagram of an intermediate frequency amplification circuit according to a first embodiment of this invention.

Referring to FIG. 1, an intermediate frequency amplification circuit according to a first embodiment of this invention comprises an amplification part 21 which is operable in response to a circuit input signal $V_{IN}$ to produce a circuit output signal $V_{OUT}$ subjected to amplification. The circuit input signal $V_{IN}$ is given across a pair of circuit input terminals while the circuit output signal $V_{OUT}$ is developed across the circuit output terminals. More particularly, the amplification part 21 comprises first through n-th stages of differential amplifiers which comprises first through n-th amplifier input terminal pairs and first through n-th amplifier output terminal pairs. The first through n-th stages of differential amplifiers may simply be called first through n-th amplifiers, respectively, and are connected in cascade to one another by successively connecting the amplifier output terminal pair of each amplifier to the amplifier input terminal pair of the next following stage of the amplifiers. In this case, the first amplifier input terminal pair is connected to the circuit input terminal pair while the n-th amplifier output terminal pair is connected to the circuit output terminal pair.

The first through n-th amplifiers are similar in structure to one another and comprise circuit elements specified by double suffixes first ones of which are indicative of stage numbers and second ones of which are indicative of element numbers. Taking this into consideration, an i-th amplifier alone will be described as a representative of the first through n-th amplifiers, where i is a natural number between unity and n, both inclusive. The i-th amplifier comprises first and second transistors $Q_{i1}$ and $Q_{i2}$ which have bases connected to an i-th amplifier input terminal pair, emitters connected in common to a constant current source $I_{io}$, and collectors which are connected to an i-th amplifier output terminal pair. The collectors of the first and the second transistors $Q_{i1}$ and $Q_{i2}$ are connected through first and second resistors $R_{i1}$ and $R_{i2}$ in common to a first source terminal which is supplied with a source voltage $V_{cc}$ which is supplied across a first source terminal and a second source terminal grounded. With this structure, an amplifier output signal $V_i$ is developed across the collectors of the i-th amplifier which may be regarded as the amplifier output terminal pair, as illustrated in FIG. 1. The collectors of the first and the second transistors $Q_{i1}$ and $Q_{i2}$ of the i-th stage are connected to the bases of the second and the first transistors $Q_{(i+1)2}$ and $Q_{(i+1)1}$ of the (i+1)-th stage. Such connections may be called twisted connections.

The illustrated intermediate frequency amplification circuit further comprises a measuring part 22 for measuring a field strength of a reception signal given to a receiver including the amplification circuit. Such measurement of the field strength is carried out by detecting a d.c. level of the circuit input signal $V_{IN}$. For this purpose, the illustrated measuring part 22 has a half-wave rectification and saturation characteristic which simulates a logarithmic characteristic.

More particularly, the measuring circuit 22 comprise first through (n+1)-th differential units as shown downwards of FIG. 1. The first through (n+1)-th differential units may simply be called first through (n+1)-th units as depicted in FIG. 1, respectively. The second through (n+1)-th units have second through (n+1)-th unit input terminal pairs connected to the first through n-th amplifier output terminal pairs of the first through (n+1)-th amplifiers, respectively, while the first unit has a first input terminal pair connected to the first amplifier input terminal pair or to the circuit input terminal pair. In this connection, the first unit is supplied with the circuit input signal $V_{IN}$. The second through (n+1)-th units are supplied with the first through n-th amplifier output signals, respectively.

The first through (n+1)-th units further have first through (n+1)-th unit output terminal pairs which are connected to an adder circuit 23 in parallel and which are supplied with first through (n+1)-th unit output signals, respectively. As readily understood from FIG.

1, the first through (n+1)-th units are similar in structure and operation to one another.

Therefore, a single one of the units alone will be described as a representative of the first through (n+1)-th units and may be depicted at the same suffix i as the amplifiers, although i is a natural number between unity and (n+1), both inclusive. The i-th unit comprises first and second transistors $Q_{if}$ and $Q_{is}$ which may be called first and second primary transistors, respectively, for convenience of description and which are specified by the second ones (f and S) of the double suffixes, respectively. The first and the second primary transistors $Q_{if}$ and $Q_{is}$ have first and second emitter regions, first and second base regions, and first and second collector regions when such transistors are manufactured by a semiconductor integration technique. Herein, it is to be noted that the first and the second emitter regions have a first area $S_o$ and a second area $kS_o$ where k is a factor greater than unity. The factor may be called an area factor. In other words, the first and the second emitter regions have different areas from each other. In this connection, the second emitter region is specified by a double line in FIG. 1.

In the i-th unit, the first and the second emitter regions are connected in common to a constant current source $I_{i1}$. The first and the second base regions are connected to the circuit input terminal pair and the i-th amplifier output terminal pair when the i-th unit is the first unit and either one of the second through (n+1)-th amplifiers, respectively. More specifically, the first and the second primary transistors $Q_{1f}$ and $Q_{1s}$ of the first unit have the first and the second base regions connected to the bases of the first and the second transistors $Q_{11}$ and $Q_{12}$ of the first amplifier, respectively, while the first and the second primary transistors of each of the second through (n+1)-th units have the first and the second base regions connected to the collectors of the second and the first transistors $Q_{i2}$ and $Q_{i1}$, respectively. Thus, the base regions of the second through (n+1)-th units are connected to the collectors of the first through n-th amplifiers in a twisted manner like the connections between two adjacent ones of the first through n-th amplifiers.

In addition, the first collector regions of the first through (n+1)-th units are connected in common to a first adder terminal of the adder circuit 23 while the second collector regions of the first through (n+1)-th units are connected in common to a second adder terminal of the adder circuit 23.

At any rate, first through (n+1)-th collector currents of a first kind are caused to flow through the first collector regions of the first primary transistors Qif of the first through (n+1)-th units, respectively, and are depicted at Ic11 through $I_{c1(n+1)}$, respectively, while first through (n+1)-th collector currents Ic21 to $I_{c2(n+1)}$ of a second kind are caused to flow through the second collector regions of the second primary transistors $Q_{is}$ of the first through (n+1)-th units, respectively. The collector currents $I_{c1i}$ and $I_{c2i}$ might often simply be referred to as first- and second-kind collector currents, respectively. The first collector regions of the first primary transistors $Q_{if}$ form first ones of the unit output terminal pairs and are connected in common to a first adder input terminal of the adder circuit 23 while the second collector regions of the second primary transistors $Q_{is}$ form second ones of the unit output terminal pairs and are connected in common to a second adder input terminal of the adder circuit 23.

The adder circuit 23 comprises a current mirror circuit composed of a first additional transistor $Q_{o1}$ and a second additional transistor $Q_{o2}$. The first additional transistor $Q_{o1}$ has a collector and an emitter connected to the first and the second adder input terminals, respectively. In other words, the collector of the first additional transistor $Q_{o1}$ is connected to the first collector regions of the first primary transistors $Q_{if}$ of the first through (n+1)-th units while the emitter of the first additional transistor $Q_{o1}$ is connected to the second collector regions of the second primary transistors $Q_{is}$ of the first through (n+1)-th units. The collector of the first additional transistor $Q_{o1}$ is connected in common to a base of the first additional transistor $Q_{o1}$ and also to a base of the second additional transistor $Q_{o2}$.

The second additional transistor $Q_{o2}$ has an emitter which is connected in common to the emitter of the first additional transistor $Q_{o1}$ on one hand and which is connected to the first source terminal ($V_{cc}$) on the other hand. A collector of the second additional transistor $Q_{o2}$ is connected to a smoothing circuit comprising a resistor $R_{o1}$ and a capacitor $C_{o1}$ which are connected in parallel. As a result, a collector current $I_o$ of the second additional transistor $Q_{o2}$ is sent to the resistor $R_{o1}$ to be converted into an output voltage $V_{log}$ from an adder output terminal 25. The collector current $I_o$ is substantially equal to a sum of the first through (n+1)-th collector currents $I_{c11}$ to $I_{c1(n+1)}$ of the first kind. In FIG. 1, the sum is represented by $I_o'$. Therefore, the output voltage $V_{log}$ is representative of the d.c. level of the circuit input signal $V_{IN}$ and may therefore be referred to as a field strength signal.

Now, consideration will be directed to the i-th unit which is operable in cooperation with the (i-1)-th amplifier on the assumption that the (i−1)-th amplifier produces an (i−1)-th amplifier output signal $V_{i-1}$. As readily understood from FIG. 1, the following equation holds;

$$V_{bef} - V_{bes} + V_{i-1} = 0, \quad (1)$$

where $V_{bef}$ is representative of a base-emitter voltage of the first primary transistor $Q_{i1}$; $V_{bes}$, a base-emitter voltage of the second primary transistor $Q_{i1}$.

As known in the art, each of the base-emitter voltage can be related to a saturation current of a transistor and to $V_T$ which is generally called the voltage equivalent of temperaure and which is given by:

$$V_T = k'T/q,$$

where k' represents the Boltzmann constant; q, an electronic charge; and T, an absolute temperature. It is to be noted here that the above-mentioned area factor k has no direct connection with the Boltzmann constant k'. Taking this into consideration, $V_{bef}$ and $V_{bes}$ are given by:

$$V_{bef} = V_T \ln(I_{ci1}/I_{si1}) \quad (2)$$

and $$V_{bes} = V_T \ln(I_{ci2}/I_{si2}), \quad (3)$$

where $I_{si1}$ and $I_{si2}$ represents saturation currents of the first and the second primary transistors $Q_{if}$ and $Q_{is}$, respectively. In addition, suffixes i are also attached to the saturation currents to specify the i-th unit, as are the cases with the first- and the second-kind collector currents $I_{ci1}$ and $I_{ci2}$.

In order to calculate the first- and the second-kind collector current $I_{ci1}$ and $I_{ci2}$, consideration will be made about a current amplification factor of each of the first and the second primary transistors depicted at $\alpha_F$. In this event, a relationship between a constant current of the constant current source $I_{i1}$ and the first- and the second-kind collector currents $I_{ci1}$ and $I_{ci2}$ is given by:

$$I_{ci1}+I_{ci2}=(1/\alpha_F)I_{i1}. \qquad (4)$$

On the other hand, the saturation currents $I_{si1}$ and $I_{si2}$ are proportional to the areas of the emitter regions of the first and the second primary transistors $Q_{if}$ and $Q_{is}$ and a relationship between the above-mentioned saturation currents is therefore given by:

$$I_{si1}/I_{si2}=1/k. \qquad (5)$$

From Equations 1, 2, 3, 4, and 5, the first- and the second-kind collector currents $I_{ci1}$ and $I_{ci2}$ are represented by:

$$I_{ci1}=\alpha_F I_{i1}/(1+k\exp(-V_{i-1}/V_T)) \qquad (6)$$

and $$I_{ci2}=\alpha_F I_{i1}/(1+(1k)\exp(V_{i-1}/V_T)) \qquad (7)$$

Figure 2:
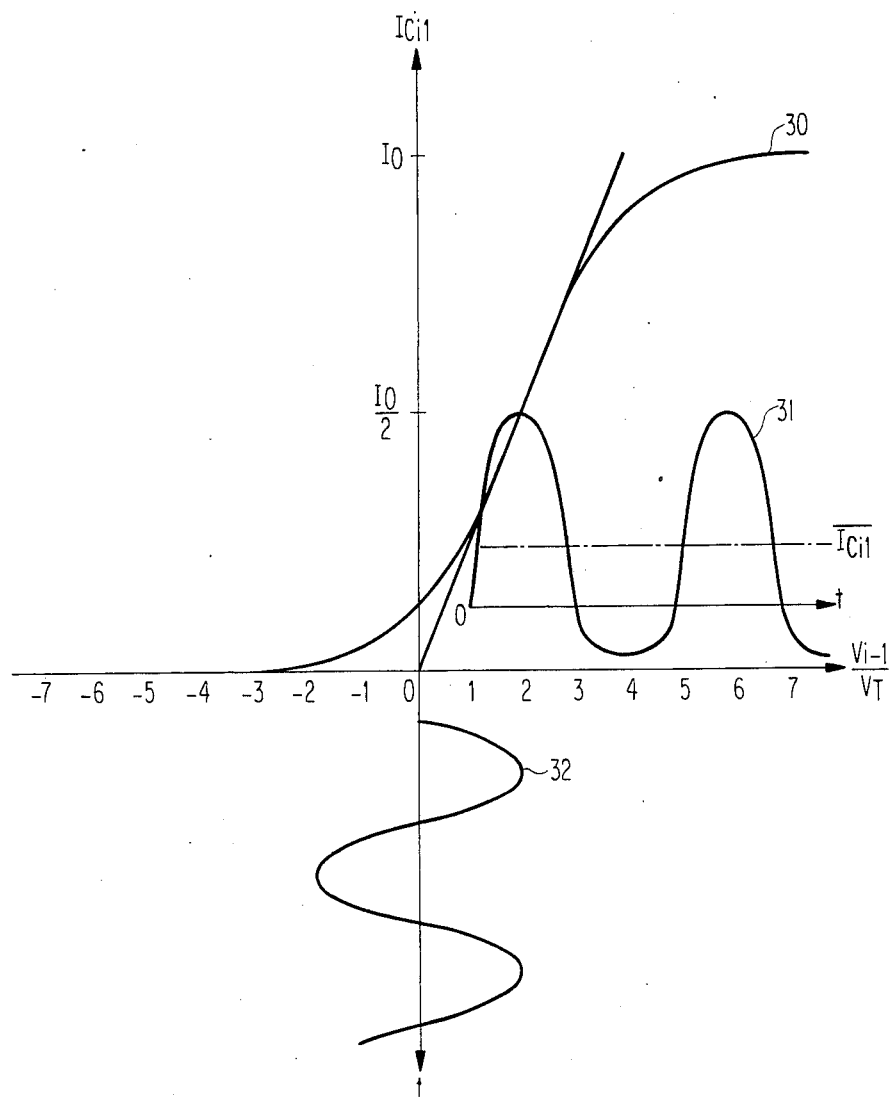
FIG. 2 is a graphical representation for use in describing operation of a single unit included in the amplification circuit illustrated in FIG. 1.

Referring to FIG. 2, wherein the abscissa and the ordinate represent a ratio of $(V_{1-1}/V_T)$ and $I_{ci1}$, respectively, a curve 30 represents a relationship expressed by Equation 6 on the assumption that $\alpha_F$ and k are equal to unity and exp 2, respectively. Herein, let exp 2 be approximately equal to 7.389. As readily understood from FIG. 2, the curve 30 exhibits a half-wave rectification and saturation characteristic. This shows that the first-kind collector current $I_{ci1}$ has the half-wave and saturation characteristic with respect to $V_{i-1}$ given from the (i−1)-th amplifier.

Accordingly, each of the first through (n+1)-th units produces a collector current having a current waveform shown at a curve 31 when a waveform of an input signal varies with time as specified by a curve 32. At any rate, the collector current has a d.c. current level depicted at $\overline{I_{ci1}}$ in FIG. 2.

Referring back to FIG. 1, the amplifier output signal $V_i$ becomes large with an increase of the number i because each amplifier has a gain which is summed up from the first stage to the n-th stage. In other words, the n-th amplifier output signal $V_n$ has a maximum level and the amplifier output signals $V_i$ become successively small with a decrease of the number i.

This shows that saturation at first begins at the first-kind collector current $I_{c1(n+1)}$ of the (n+1)-th unit of the measuring circuit 22 when the circuit input signal $V_{IN}$ is increased. Thereafter, the remaining collector currents $I_{c1n}$ through $I_{c11}$ are successively put into saturated states. As a result, the first-kind collector current $I_{c11}$ of the first unit is finally saturated. Such first-kind collector currents $I_{ci1}$ of the first through (n+1)-th units are summed up by the adder circuit 23 to be smoothed into the output voltage $V_{log}$ by the parallel circuit of the resistor $R_{o1}$ and the capacitor $C_{o1}$. The resultant collector current $I_o$ exhibits, with respect to the circuit input signal $V_{IN}$, a logarithmic characteristic approximated by a straight line.

Consideration will be made about an additional output current $I_o'$ which flows through the collector of the first additional transistor $Q_{o1}$ and which is substantially equal to the output current $I_o$. The additional output current $I_o'$ is equal to a total sum of the first-kind collector currents $I_{ci1}$ of the first primary transistors $Q_{if}$. Therefore, the additional output current $I_o'$ is given by:

$$I_o' = \sum_{i=1}^{n+1} I_{ci1}.$$

If a d.c. component of the additional output current $I_o'$ is represented by $\overline{I_o'}$, the following equation holds:

$$\overline{I_o'} = \sum_{i=1}^{n+1} \overline{I_{ci1}}.$$

Figure 3:
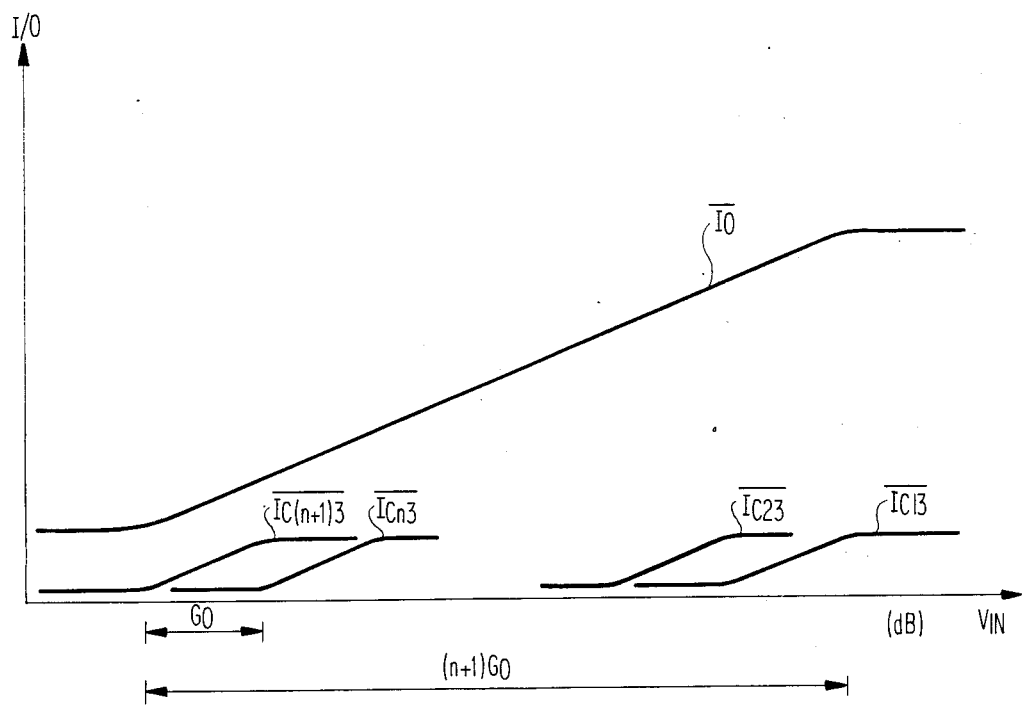
FIG. 3 is another graphical representation for use in describing a combination of a plurality of the units illustrated in FIG. 1.

Referring to FIG. 3 together with FIG. 1, a characteristic of the d.c. output current $\overline{I_o}$ is illustrated on the assumption that k and the gain of each stage of the amplifiers are equal to 7.389 and $G_o$ dB, respectively.

Under the circumstances, the output voltage $V_{log}$ is given by:

$$V_{log}=R_{o1}\times\overline{I_o}.$$

Therefore, the output voltage $V_{log}$ has the logarithmic characteristic with respect to the circuit input signal $V_{IN}$.

Figure 4:
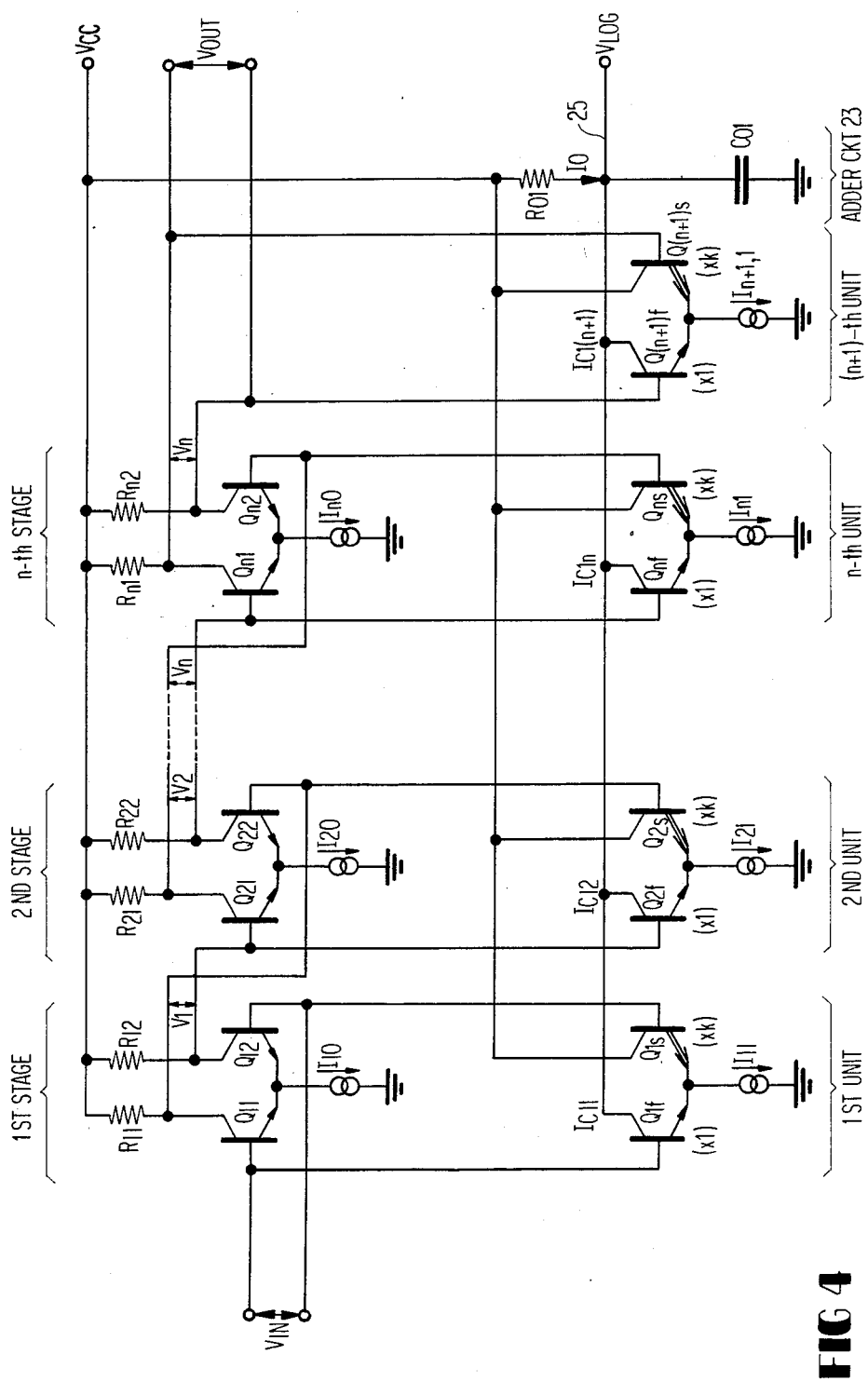
FIG. 4 is a circuit diagram of an intermediate frequency amplification circuit according to a modification of the first embodiment illustrated in FIG. 1.

Referring to FIG. 4, an intermediate frequency amplification circuit according to a modification of the first embodiment is similar in sturcture to that illustrated in FIG. 1 except that the adder circuit 23 comprises a series circuit of a resistor $R_{o1}$ and a capacitor $C_{o1}$ instead of a combination of the parallel circuit of the resistor and the capacitor and the current mirror circuit. As shown in FIG. 4, the resistor $R_{o1}$ is connected between the first source terminal and the output terminal 25 while the capacitor $C_{o1}$ is connected between the output terminal 25 and a second source terminal grounded. The collector regions of the first primary transistors $Q_{if}$ are connected in common to the output terminal 25 while the collector regions of the second primary transistors $Q_{is}$ are connected to the first source terminal ($V_{cc}$).

In the illustrated circuit, the output voltage $V_{log}$ is given by:

$$V_{log}=V_{cc}-R_{o1}I_o,$$

where Vcc represents the first source voltage supplied to the first source terminal. With this structure, it is possible to reduce the first source voltage Vcc to 1.0 volt or so. Therefore, the first source voltage $V_{cc}$ becomes low in comparison with that illustrated in FIG. 1.

As readily understood from FIG. 3, it is possible to expand a dynamic range of the logarithmic characteristic by increasing both of the amplifier stages and the units and to improve linearity of the logarithmic characteristic by selecting each gain of the amplifier stages and the units. Thus, only one capacitor may be included in the illustrated circuit and may be connected to the output terminal 25 for $V_{log}$. This shows that the capacitor $C_{o1}$ may be connected outside of an integrated circuit. It is, therefore, possible to lower an intermediate frequency.

Figure 5:
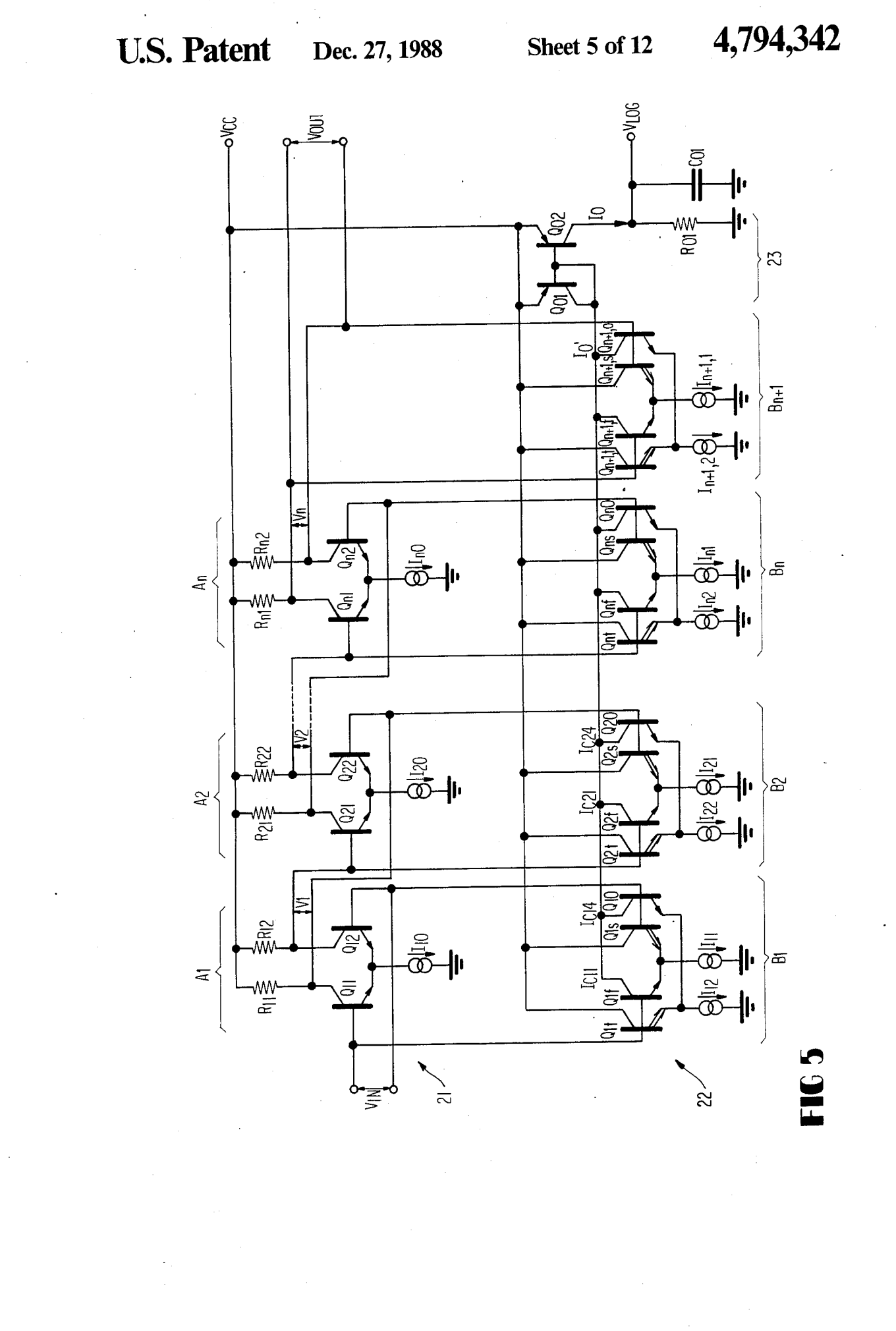

Referring to FIG. 5, an intermediate frequency amplification circuit according to a second embodiment of this invention is similar to that illustrated in FIG. 1 except that each of the first through (n+1)-th differential units illustrated in FIG. 5 comprises an internal circuit different from that of FIG. 1 and is depicted at $B_1$ through $B_{n+1}$. In this connection, the first through n-th differential stages are depicted at $A_1$ to $A_n$ in FIG. 5. Therefore, description will be mainly directed to an i-th differential unit $B_i$ as a representative of the differential units $B_1$ to $B_{n+1}$. Briefly, each of the illustrated differential units $B_1$ to $B_{n+1}$ has a full-wave rectification characteristic, differing from the units illustrated with reference to FIG. 1. In order to accomplish such a full-wave rectification characteristic, the i-th differential unit $B_i$ comprises a primary differential circuit of first and second primary transistors $Q_{if}$ and $Q_{is}$ similar to those illustrated with reference to FIG. 1. Accordingly, the emitter regions of the first and the second primary transistors $Q_{if}$ and $Q_{is}$ have the emitter areas specified by 1:k. Therefore, the area factor is represented by k, as in the case with FIG. 1.

In the example being illustrated, the i-th differential unit further comprises an additional differential circuit of first and second subsidiary transistors $Q_{it}$ and $Q_{io}$ which may be similar to the second and the first primary transistors $Q_{if}$ and $Q_{is}$, respectively. Therefore, the first subsidiary transistor $Q_{it}$ has the emitter area equal to k-times the emitter area of the second subsidiary transistor $Q_{io}$. Anyway, an area factor between the emitter areas of the first and the second subsidiary transistors $Q_{it}$ and $Q_{io}$ is represented by k. For brevity of description, the first and the second primary transistors $Q_{if}$ and $Q_{is}$ may be named first and second transistors, respectively, while the first and the second subsidiary transistors $Q_{it}$ and $Q_{io}$ may be called third and fourth transistors, respectively.

The third and the fourth transistors $Q_{it}$ and $Q_{io}$ have the emitter regions connected in common to a subsidiary constant current source depicted at $I_{i2}$. The base region of the third transistor $Q_{it}$ is connected in common to the base region of the first transistor $Q_{if}$ while the base region of the fourth transistor $Q_{io}$ is connected in common to the base region of the second transistor $Q_{is}$. Moreover, the collector regions of the second and the third transistors $Q_{is}$ and $Q_{it}$ are connected in common to each other while the collector regions of the first and the fourth transistors $Q_{if}$ and $Q_{io}$ are also connected in common to each other.

From this fact, it is seen that the base regions of the third and the fourth transistors $Q_{it}$ and $Q_{io}$ are supplied with the output signal $V_{i-1}$ of the (i−1)-th amplifier stage $A_{i-1}$ in the manner illustrated in FIG. 1 while the base regions of the third and the fourth transistors $Q_{it}$ and $Q_{io}$ are supplied with the circuit input signal $V_{IN}$.

As a result, the collector regions of the first and the fourth transistors $Q_{if}$ and $Q_{io}$ are connected to the first adder input terminal of the adder circuit 23 while the collector regions of the second and the third transistors $Q_{i2}$ and $Q_{i3}$ are connected to the second adder input terminal of the adder circuit 23. The adder circuit 23 is similar in structure and operation to that illustrated in FIG. 1 and sums up collector currents $I_{ci1}$ and $I_{ci4}$ of the first and fourth translators $Q_{if}$ and $Q_{io}$ of the respective differential units $B_1$ to $B_{n+1}$. A result of the above-mentioned sum is produced through the collector of the transistor $Q_{o2}$ as the output current which is depicted at a d.c. component $I_o$ of the output current $I_o$ in FIG. 5.

The output current $I_o$ is converted into a d.c. output voltage $V_{log}$ by the capacitor $C_{o1}$ and the resistor $R_{o1}$.

Now, description will be made about the i-th differential unit $B_i$ on the assumption that the collector currents of the first and the fourth transistors $Q_{i1}$ and $Q_{i4}$ are represented by $I_{ci1}$ and $I_{ci4}$ and the output signal of the (i−1)-th amplifier stage $A_{i-1}$ is represented by $V_{i-1}$. A sum $I_i$ of the collector currents $I_{ci1}$ and $I_{ci4}$ can be calculated in a manner similar to that mentioned in conjunction with FIG. 1 and is given by:

$$
\begin{aligned}
I_i &= I_{ci1} + I_{ci4} \\
&= (\alpha_F I_{i1})/(1 + (1/k)\exp(V_{i-1}/V_T)) + \\
&\quad (\alpha_F I_{i1})/(1 + (1/k)\exp(-V_{i-1}/V_T)) \\
&= \alpha_F I_{i1}(1 + (k - 1/k) \div (2\cosh(V_1/V_T) + \\
&\quad (k + 1/k)).
\end{aligned}
\tag{8}
$$

Inasmuch as $\cosh(V_1/V_T)$ is equal to $\cosh(-V_1/V_T)$ as known in the art, Equation (8) represents an even function. Therefore, the sum $I_i$ exhibits a characteristic symmetrical with respect to $V_{i-1}=0$.

Figure 6:
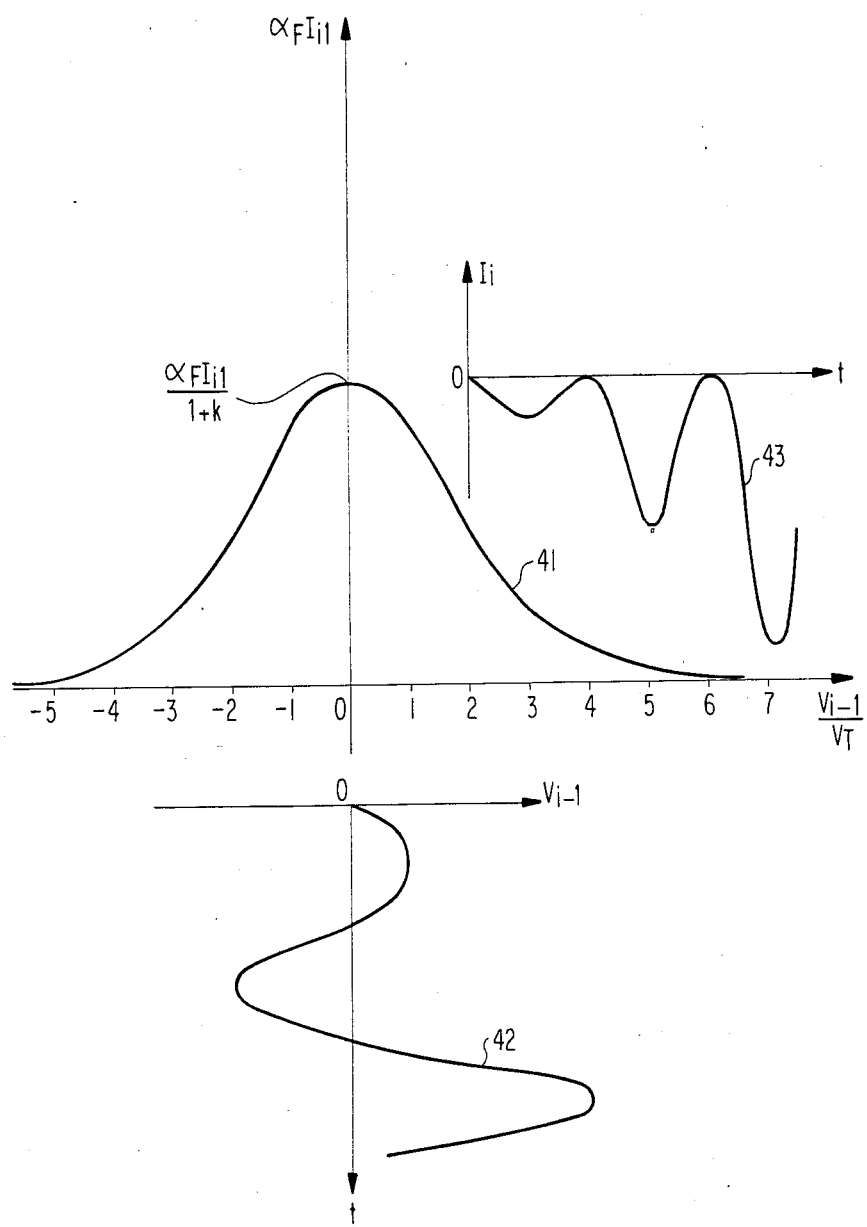
FIG. 6 is a graphical representation for use in describing a single unit included in the amplification circuit illustrated in FIG. 5.

Referring to FIG. 6, wherein the abscissa and ordinate represent $(V_{i-1}/V_T)$ and $\alpha_F I_i$, respectively, a relationship between $V_{i-1}$ and $I_i$ is specified by a curve 41 when k is equal to three. When the $V_{i-1}$ varies with time as shown at a curve 42, the output current $I_i$ also varies as depicted at a curve 43.

From the curve 41, it is seen that each differential unit has the full-wave rectification characteristic and a limiting characteristic.

Referring back to FIG. 5, saturation and limiting take place from the collector currents of the first and the fourth transistors $Q_{n+1,1}$ and $Q_{n+1,4}$ of the (n+1)-th differential unit $B_{n+1}$, like in FIG. 1. On occurrence of such saturation, the collector current $I_{n+1}$ is nearly equal to zero. Under the circumstances, the logarithmic characteristic is accomplished by summing up the collector currents $I_{ci1}$ and $I_{ci4}$ and by smoothing them.

For example, the collector current $I_i$ of the i-th differential unit $B_i$ is equal to $\alpha_F I_{i1}/(1+k)$ on reception of no signal. On the other hand, the collector current $I_i$ becomes zero when saturation occurs as a result of reception of a large signal.

Taking the above into consideration, a d.c. component $\overline{I_o}$ of the output current $I_o$ in the adder circuit 23 is given by:

$$
I_o = \sum_{i=1}^{n+1} \alpha_F I_{i1} \left(1 + \frac{1 - 1/k}{2\cosh(V_{i-1}/V_T) + k + (1/k)}\right)
$$

Figure 7:
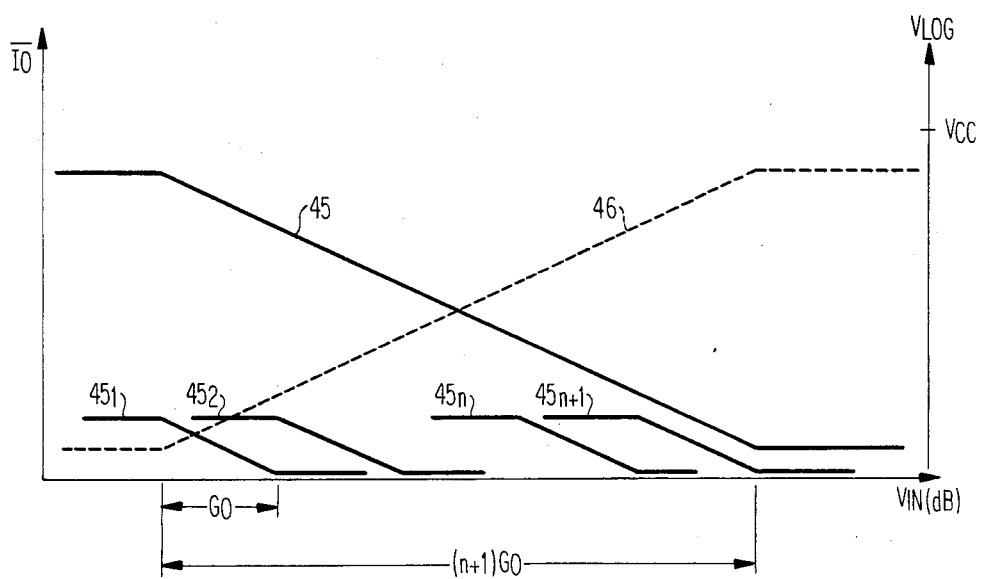
FIG. 7 is another graphical representation for use in describing a combination of the units included in the amplification circuit illustrated in FIG. 5.

Referring to FIG. 7, a curve 45 shows a variation of the d.c. component $\overline{I_o}$ shown by Equation (9) on condition that the area factor k and the gain of each differential unit are equal to 3 and $G_o$, respectively. The illustrated curve 45 is drawn as a result of addition of curves $45_1$ through $45_{(n+1)}$ which specify the collector currents $I_1$ to $I_{n+1}$.

Inasmuch the output voltage $V_{log}$ is given by:

$$V_{log} = R_{o1}\overline{I_o},$$

the output voltage $V_{log}$ varies as depicted at a curve 46.

As shown by the curves 45 and 46, the output current $I_o$ and the output voltage $V_{log}$ have the logarithmic characteristics approximated by broken lines.

The amplification circuit illustrated in FIG. 5 is operable by the source voltage $V_{cc}$ of 1.5 V. Therefore, it is possible to reduce the source voltage $V_{cc}$.

Figure 8:
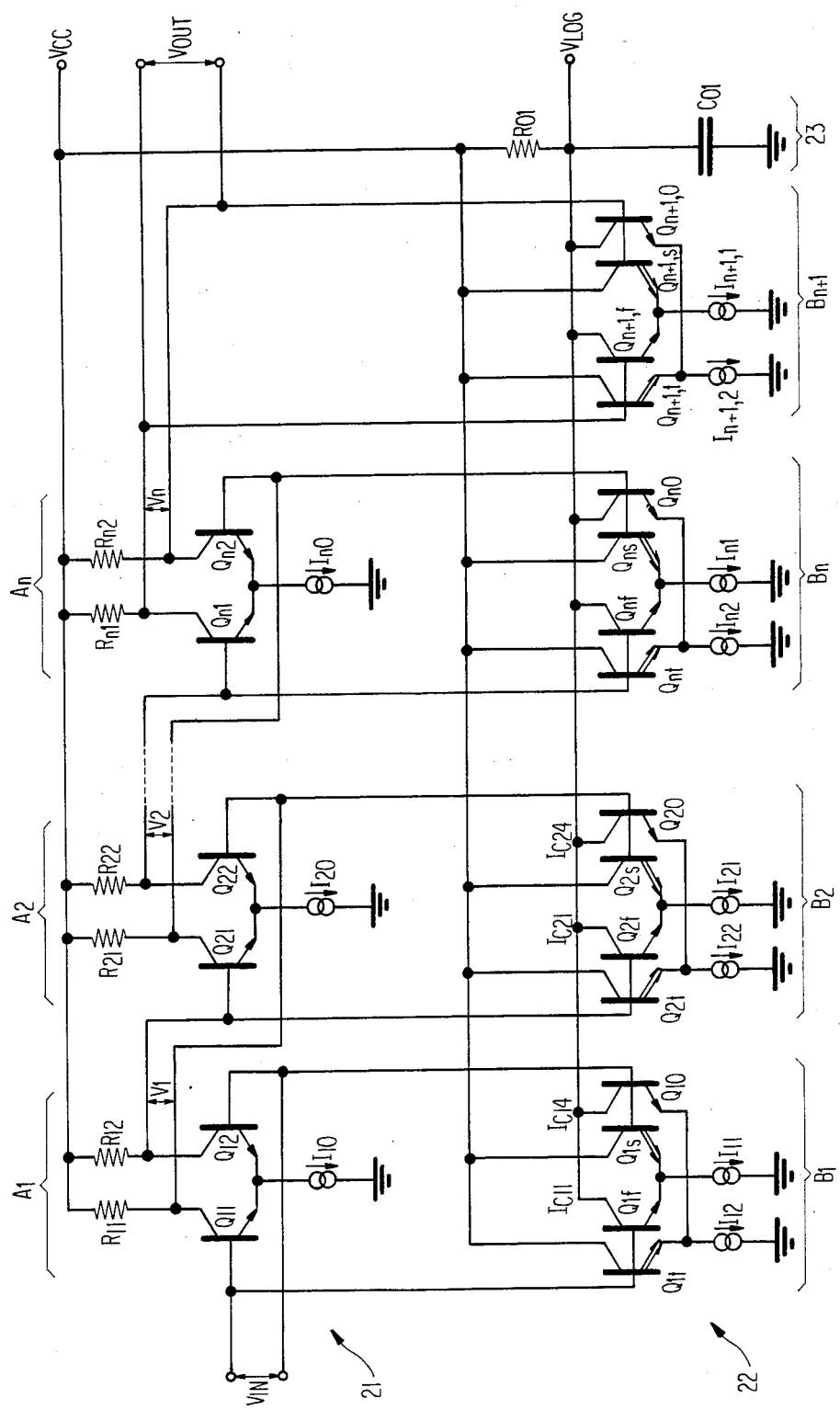
FIG. 8 is a circuit diagram of an intermediate frequency amplification circuit according to a modification of the second embodiment illustrated in FIG. 5.

Referring to FIG. 8, an intermediate frequency amplification circuit according to a modification of the second embodiment is similar in structure and operation except that the adder circuit 23 comprises a series connection of a resistor $R_{o1}$ and a capacitor connected to the first and the second source terminals, instead of a combination of the current mirror circuit and the parallel connection of the resistor $R_{o1}$ and the capacitor $C_{o1}$ illustrated in FIG. 5.

With this structure, the output voltage $V_{log}$ is given by:

$$V_{log} = V_{cc} - R_{o1}I_o,$$

and can be further reduced in comparison with that illustrated in FIG. 5. In fact, the amplification circuit illustrated in FIG. 8 is operable by the source voltage $V_{cc}$ of 1.0 V.

Figure 9:
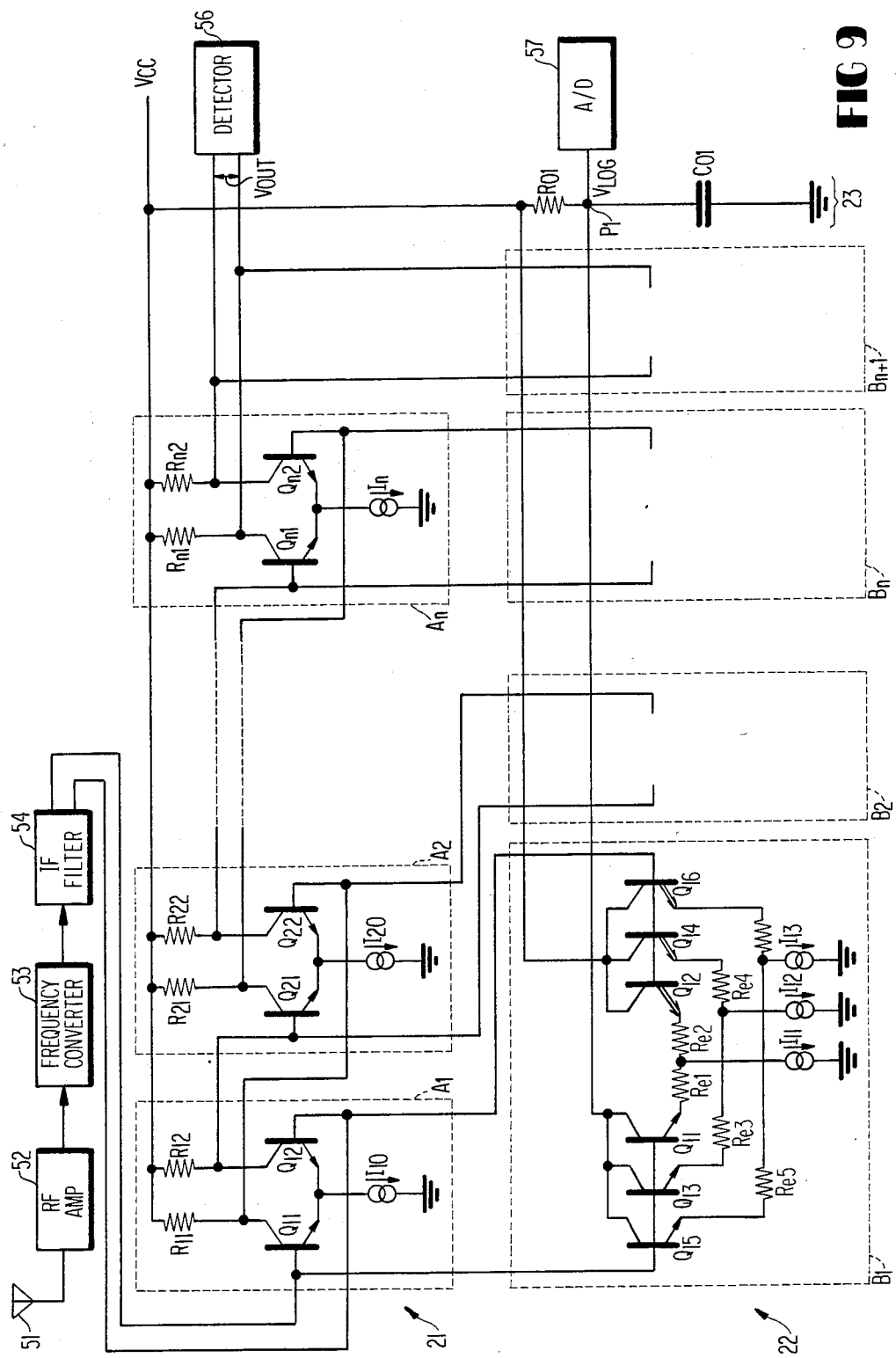
FIG. 9 is a circuit diagram of an intermediate frequency amplification circuit according to a third embodiment of this invention.

Referring to FIG. 9, an intermediate frequency amplification circuit according to a third embodiment of this invention comprises similar parts designated by like reference numerals and symbols. In FIG. 9, the illustrated amplification circuit is supplied with the circuit input signal $V_{IN}$ through an antenna 51, a radio frequency (RF) amplifier 52, a frequency converter 53, and an intermediate frequency (IF) filter 54 to supply the circuit output signal $V_{out}$ and the field strength signal or output signal $V_{log}$ to a detector 56 and an analog-to-digital (A/D) converter 57, respectively.

Like in FIG. 5, the amplification circuit has the first and the second source terminals supplied with the source voltage $V_{cc}$ thereacross and comprises an amplification part 21 similar to that illustrated in FIG. 5, a measuring part 22 to be described in detail later, and an adder circuit 23 of a series connection of a resistor $R_{o1}$ and a capacitor $C_{o1}$ which is similar to that illustrated in FIGS. 4 and 7. The field strength signal $V_{log}$ is derived from a point P1 of connection between the resistor $R_{o1}$ and the capacitor $C_{o1}$. The point P1 of connection may therefore be called an output terminal.

Now, the illustrated measuring part 22 comprises first through (n+1)-th differential units $B_1$ to $B_{n+1}$ which are connected to the amplifier stages $A_1$ to $A_n$ in the manner described in conjunction with FIGS. 1 and 5, respectively, and which are similar in structure to one another. Under the circumstances, the first differential unit $B_1$ alone will be described as representative of the differential units $B_1$ and $B_{n+1}$.

In FIG. 9, the illustrated differential unit $B_1$ comprises first through sixth unit transistors $Q_{11}$, $Q_{12}$, $Q_{13}$, $Q_{14}$, $Q_{15}$ and $Q_{16}$ which may be generally represented by $Q_{i1}$ to $Q_{i6}$, respectively, and which divided into an odd number group of the first, the third, and the fifth unit transistors $Q_{i1}$, $Q_{i3}$, and $Q_{i5}$ and an even number group of the second, the fourth and the sixth unit transistors $Q_{i2}$, $Q_{i4}$, and $Q_{i6}$. The unit transistors $Q_{i1}$, $Q_{i3}$, and $Q_{i5}$ of the odd number group have collector regions connected in common to the point P1 of connection and which may collectively be referred to as a first group of transistors. The unit transistors of the first odd number group further have emitter regions each of which has an emitter area depicted as $S_o$. The unit transistors $Q_{i2}$, $Q_{i4}$, and $Q_{i6}$ of the even number group have collector regions connected in common to the first source terminal ($V_{cc}$) and emitter regions which have emitter areas equal to $k_{11}S_o$, $k_{12}S_o$, and $k_{13}S_o$ where $k_{11}$, $k_{12}$, and $k_{13}$ are greater than unity.

The base regions of the odd number group transistors of the first differential unit $B_1$ are connected in common to the base of the transistor $Q_{11}$ of the amplifier stage $A_1$ while the base regions of the even number group transistors of the first differential unit $B_1$ are connected in common to the base of the transistor $Q_{12}$ of the amplifier stage $A_1$.

As readily understood by comparing FIG. 9 with FIG. 5, the base regions of the odd number group transistors of the second through (n+1)-th differential unit are connected in common to the collector of the second transistor $Q_{(i-1)2}$ of the (i−1)-th amplifier stage $A_{i-1}$ while the base regions of the even number group transistors of the second through (n+1)-th differential units $A_2$ to $A_{n+1}$ are connected in common to the collector of the first transistor $Q_{(i-1)1}$ of the (i−1)-th amplifier stage $A_{i-1}$.

Each transistor of the odd number group is paired with a selected one of the even number transistors. More particularly, the first and the second transistors $Q_{11}$ and $Q_{12}$ have the emitter regions connected in common to a first subsidiary constant current source specified by a constant current $I_{11}$ through first and second emitter resistors $R_{e1}$ and $R_{e2}$, respectively. The first and the second unit transistors $Q_{11}$ and $Q_{12}$ may be made to correspond to the first and the second primary transistors $Q_{if}$ and $Q_{is}$ described with reference to FIG. 1.

The third and the fourth unit transistors $Q_{13}$ and $Q_{14}$ have the emitter regions connected to a second subsidiary constant current source ($I_{12}$) through third and fourth emitter resistors $R_{e3}$ and $R_{e4}$, respectively. The third and the fourth unit transistors $Q_{13}$ and $Q_{14}$ may be made to correspond to the second and the first additional transistors $Q_{io}$ and $Q_{it}$ illustrated in FIG. 5, respectively.

Likewise, the fifth and the sixth unit transistors $Q_{15}$ and $Q_{16}$ have the emitter regions connected to a third subsidiary constant current source ($I_{13}$) through fifth and sixth emitter resistors $R_{e5}$ and $R_{e6}$, respectively, and may be called first and second subsidiary transistors, respectively.

It is assumed that the second, the fourth, and the sixth emitter resistors $R_{e2}$, $R_{e4}$, and $R_{e6}$ are given by:

$$R_{e2} = (1/k_{11})R_{e1},$$

$$R_{e4} = (1/k_{12})R_{e3},$$

and $$R_{e6} = (1/k_{13})R_{e5}.$$

Herein, the number of the transistor pairs may be generalized into $m_1$ in addition to the number of the emitter register pairs. In this event, the transistors $Q_{11}$, $Q_{13}$, and $Q_{15}$ of the odd number group can be represented by $Q_{1,2m1-5}$; $Q_{1,2m1-3}$; and $Q_{1,2m1-1}$, respectively, while the transistors $Q_{12}$, $Q_{14}$, and $Q_{16}$ the even number group can be represented by $Q_{1,2m1-4}$; $Q_{1,2m1-2}$; and $Q_{1,2m1}$, respectively, when $m_1 = 3$.

Likewise, the resistors $R_{e1}$, $R_{e3}$, $R_{e5}$ may be generalized into $R_{e2m1-5}$, $R_{e2m1-3}$, $R_{e2m1-1}$ while the resistors $R_{e2}$, $R_{e4}$, $R_{e6}$ can be replaced by $R_{e2m1-4}$, $R_{e2m1-2}$, and $R_{e2m1}$.

As regards FIG. 9, collector currents of the first, the third, and the fifth unit transistors $Q_{11}$, $Q_{13}$, and $Q_{15}$ are assumed to be represented by $I_{c11}$, $I_{c13}$, and $I_{c15}$, respectively. Under the circumstances, relationship among the circuit input signal $V_{IN}$, the collector currents $I_{c11}$, $I_{c13}$, and $I_{c15}$, and the constant currents, $I_{11}$, $I_{12}$, and $I_{13}$ are given by:

$$V_{IN} = V_T \ln(1/k_{11})((\alpha_F I_{11}/I_{c11}) - 1) + \\ (R_{e1}/\alpha_F)(((1/k_1) + 1)I_{c11} + \alpha_F I_{11}) \\ = V_T \ln(1/k_{12})((\alpha_F I_{12}/I_{c12}) - 1) + \\ (R_{e2}/\alpha_F)(((1/k_{12}) + 1)I_{c12} + \alpha_F I_{12}) \\ = V_T \ln(1/k_{13})((\alpha_F I_{13}/I_{c13}) - 1) + \\ (R_{e3}/\alpha_F)(((1/k_{13}) + 1)I_{c13} + \alpha_F I_{13}), \quad (10)$$

where $\alpha_F$ is representative of a current amplification factor.

When, each of the first through $(n+1)$-th differential units $B_1$ to $B_{n+1}$ may comprise first through $m_1$-th pairs of the transistors selected from the odd and the even number groups of the transistors, introduction may be made about a variable j which is variable between unity and $m_1$, both inclusive. Taking this into account, Equation (10) is generalized into:

$$V_{IN} = V\ln(1/k_j)((\alpha_F I_{1j}/I_{c1,2j-1}) - 1)(R_{ej}/\alpha_F)(((1/k_{1j}) + 1)I_{c1,2j-1} + \alpha_F I_{1j}) \quad (11)$$

Differentiation of Equation (11) with respect to $I_{c1,2j-1}$ gives:

$$dV_{IN}/dI_{c1,2j-1} = -(V_T \alpha_F I_{1j})/I_{c1,2j-1}^2 ((\alpha_F I_{1j}/I_{c1,2j-1}) - 1 + R_{e1}/\alpha_F((1/k_{1j}) + 1). \quad (12)$$

If $I_{c1,2j-1} = \alpha_F I_{1j}/2$, Equation (12) is rewritten into:

$$dV_{IN}/dI_{c1,2j-1} = (-4V_T/\alpha_F I_{1j}) + (R_{ej}/2)((1/k_{1j}) + 1). \quad (13)$$

Likewise, Equation (11) is rewritten into:

$$V_T = (\tfrac{1}{2})R_{ej}I_{1j}((1/k_{1j}) + 3) - V_T \ln k_{1j}. \quad (14)$$

If a tangential line specified by Equation (12) passes through an origin, division of Equation (14) by $(\alpha_F I_{1j}/2)$ gives:

$$V_{IN}/(\alpha_F I_{1j}/2) = ((\tfrac{1}{2})R_{ej}I_{1j}((1/k_{1j}) + 3) - V_T \ln k_{1j})/(\alpha_F I_{1j}/2) = (-4V_T/I_{1j}) + ((1/k_{1j}) + 1)R_{ej}/\alpha_F.$$

Accordingly, the following equation (15) holds:

$$R_{e1}I_{1j} = V_T(-2 + \ln k_{1j}). \quad (15)$$

Figure 10:
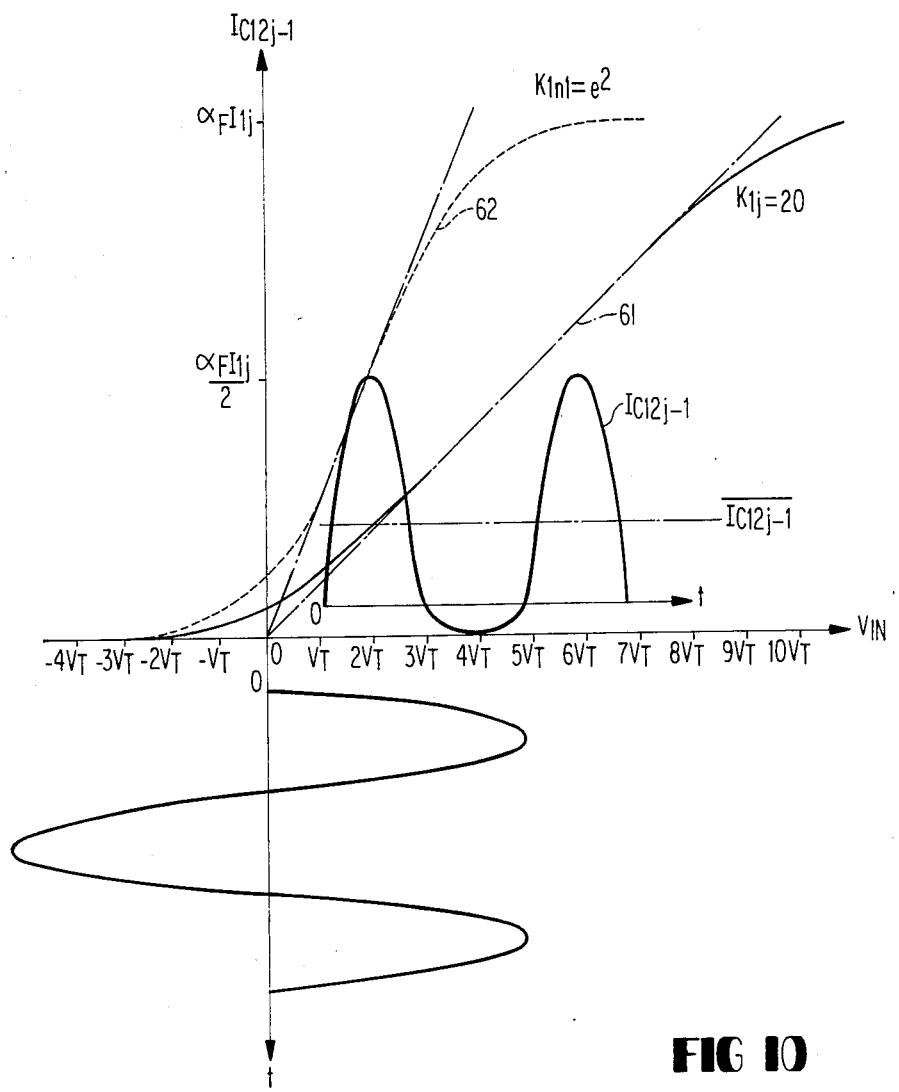
FIG. 10 is a graphical representation for use in describing operation of a single unit included in the amplification illustrated in FIG. 9.

Referring to FIG. 10, the collector current $I_{c1,2j-1}$ exhibits a half-wave rectification waveform in response to the circuit input signal $V_{IN}$, as shown by curves 61 and 62 as long as $k_{1j}$ is equal to or greater than exp 2, because Equation (15) is positive when $k_{1j}$ falls within the above-mentioned range.

With this structure, it is possible to respond to a wide range of the circuit input signal $V_{IN}$ and therefore to expand a dynamic range. With an increase of the circuit input signal $V_{IN}$, saturation takes place and the collector current gradually approaches $\alpha_F I_{1j}$.

On the other hand, consideration will be made about a predetermined constant determined by:

$$y_{1j} = 4/(k_{1j} + (1/k_{1j}) + 2),$$

and about a gain $g_{o1}$ of the first amplifier stage $A_1$ given by:

$$g_{o1} = (R_l I1/2V_T).$$

As regards the gain $g_{o1}$, it is possible to design the area factors $k_{1j}$ and $k_{1j+1}$ of the transistors of the first differential unit $B_1$ such that the following equation (18) holds:

$$y_{1j+1}/y_{1j} = m_1 \sqrt{g_{o1}}. \quad (18)$$

In this event, each input signal level which gives the relationship of $I_{c1,2j-1} = (\alpha_F I_{1j}/2)$ differs from one another in each differential unit $B_1$ and $B_{n+1}$ by $m_1 \sqrt{g_{o1}}$. Therefore, the output current $I_o$ of the adder circuit 23 is given by:

$$I_o = \sum_{i=1}^{n+1} \sum_{j=1}^{mi} I_{c1,2j-1}. \quad (19)$$

Since each collector current $I_{c1,2j-1}$ has the same phase, a d.c. component of each collector current $I_{c1,2j-1}$ never disappears even on a sum of the respective collector currents.

Therefore, the output current $I_o$ is given as a logarithmically approximated value with respect to the circuit input signal $V_{IN}$.

Herein, Equation (18) may be generalized into:

$$y_{i,j+1}/y_{i,j} = mi\sqrt{g_{o,j-1}}. \quad (20)$$

Similar logarithmic characteristic can be accomplished by the use of Equation (20) in relation to the circuit input signal $V_{IN}$.

If the source voltage and the d.c. component of the output current $I_o$ are represented by $V_{cc}$ and $\overline{I_o}$, respectively, the field strength signal $\overline{V_{log}}$ is given by:

$$\overline{V_{log}} = V_{cc} - R_{o1}\overline{I_o}.$$

Thus, a logarithmic value of the circuit input signal $V_{IN}$ is produced in the form of a d.c. voltage.

Figure 11:
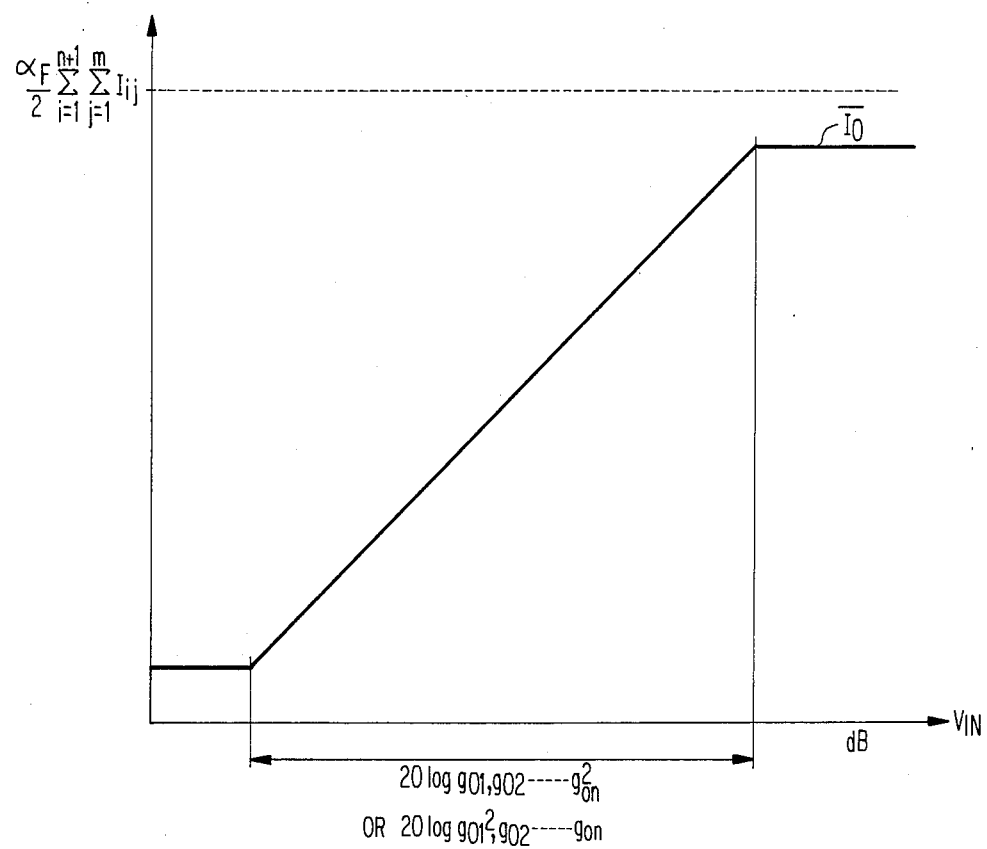
FIG. 11 is another graphical representation for use in describing operation of a combination of the units included in the amplification circuit illustrated in FIG. 9.

Referring to FIG. 11, a relationship between the circuit input signal $V_{IN}$ and the output current $I_o$ is specified by the logarithmic characteristic.

Figure 12:
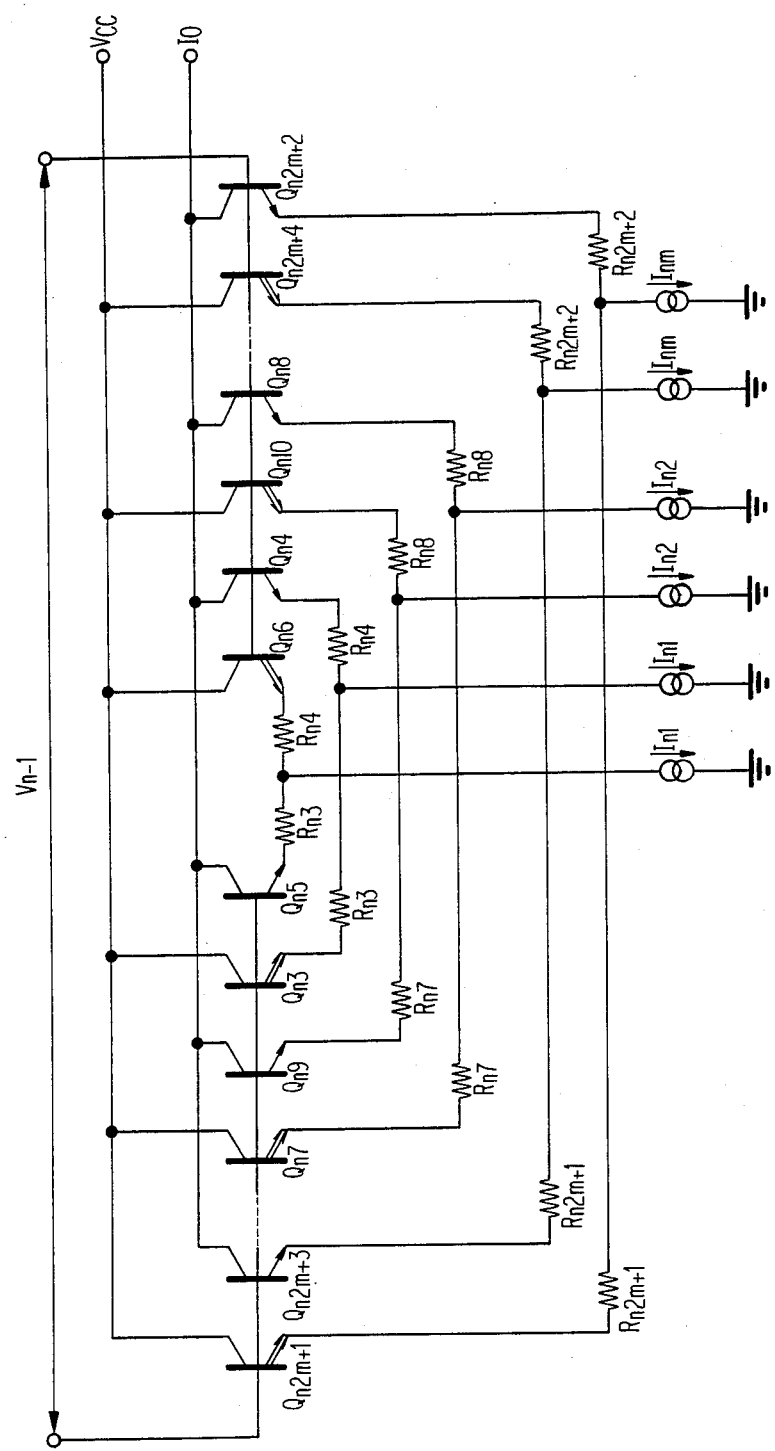
FIG. 12 is a circuit diagram of an intermediate frequency amplification circuit according to a fourth embodiment of this invention.

Referring to FIG. 12, an intermediate frequency amplification circuit according to a fourth embodiment of this invention is specified only by each differential unit which is represented by an n-th differential unit. The illustrated differential unit comprises third through $(2m+4)$-th transistors $Q_3$ to $Q_{2m+4}$ which are divided into an odd number group and an even number group. The transistors of the odd number group have base regions connected in common to one another while the transistors of the even number group have base regions connected in common to one another. Let the transistors represented by $Q_{n,2j+2}$ and $Q_{n,2j+3}$ have emitter areas represented by 1 and the transistors represented by $Q_{n,2j+1}$ and $Q_{n,2j+4}$ have emitter areas given by km, as symbolized by thick lines in FIG. 12.

Each emitter region of the transistors is connected to an emitter resistor depicted at a corresponding suffix. Herein, a relationship between a pair of the resistors is defined by:

$$R_{n,2j+1} = k_j R_{n,2j+2},$$

where $j = 1, 2, \ldots, m$.

Anyway, the emitter regions of the transistors $Q_{n,2j+1}$ and $Q_{n,2j+2}$ or $Q_{n,2j+3}$ and $Q_{n,2j+4}$ are connected to each other through the corresponding resistors. The illustrated differential unit $B_n$ is divisible into first through m-th full-wave rectification units which are driven by constant current sources $I_{n1}, I_{n2} \ldots, I_{nm}$ and which are represented by $B_{n1}, B_{n2}, \ldots, B_{nm}$. Each rectification characteristic of the rectification circuits has a gentle inclination in compliance with a product of $R_{n,2j+1}$ and $I_{nj}$ as compared with that illustrated in FIG. 10.

When such a product of $R_{n,2j+1}$ and $I_{nj}$ is changed with a variation of the number j, it is possible to improve logarithmic approximation because the number of the rectification circuits is increased.

With this structure, a dynamic range of the logarithmic characteristic can be expanded because the circuit input signal level becomes large due to addition of each emitter resistor.

While this invention has thus far been described in conjunction with several embodiments thereof, it will readily be possible for those skilled in the art to put this invention into practice in various other manners.

What is claimed is:

1. In an intermediate frequency amplification circuit operable in response to a circuit input signal to produce a circuit output signal subjected to amplification, said intermediate frequency amplification circuit comprising first through n-th differential amplifiers which have first through n-th amplifier input terminal pairs and first through n-th amplifier output terminal pairs, respectively, and which are connected in cascade from said first to said n-th differential amplifiers for successively connecting the amplifier output terminal pair of each differential amplifier to the amplifier input terminal pair of the next following differential amplifier, said circuit input signal being supplied across said first amplifier input terminal pair while said circuit output signal is produced through said n-th amplifier output terminal pair, said intermediate frequency amplification circuit further comprising a measuring circuit responsive to said circuit input signal for measuring a field strength to produce a field strength signal representative of said field strength, the improvement wherein:
said circuit measuring circuit comprises:
first through (n+1)-th differential units which have first through (n+1)-th unit input terminal pairs, respectively, said first through n-th input terminal pairs being connected to said first through n-th amplifier input terminal pairs, respectively, while said (n+1)-th unit input terminal pair is connected to said n-th amplifier output terminal pair, and first through (n+1)-th unit output terminal pairs are supplied with first through (n+1)-th unit output signals, respectively; and
an adder circuit connected to said first through (n+1)-th unit output terminal pairs for adding said first through (n+1)-th unit output signals to one another to produce said field strength signal;
each of said first through (n+1)-th differential units comprising:
a primary differential circuit of first and second primary transistors which have first and second base regions, first and second emitter regions, and first and second collector regions, respectively, said first and said second base regions of the first through n-th differential units being connected to said first through n-th amplifier input terminal pairs, respectively, while the first and second base regions of the (n+1)-th differential unit are connected to said n-th amplifier output pair, while said first and said second emitter regions have an area ratio of 1:k where k is greater than unity, and are coupled in common to each other, said first and said second collector regions being connected to said unit output terminal pair, respectively.

2. An intermediate frequency amplification circuit as claimed in claim 1, wherein said each differential unit comprises:
an additional differential circuit of first and second transistor parts which are differentially connected to each other, the first and second transistor parts of said first through n-th differential units being connected to said first through n-th amplifier input terminal pairs, respectively, while the first and second transistor parts of said (n+1)-th differential unit are connected to said n-th amplifier output terminal pair.

3. An intermediate frequency amplification circuit as claimed in claim 2, each of said first through n-th amplifier input terminal pairs consisting of first and second amplifier input terminals and each of said first through n-th amplifier output terminal pairs consisting of first and second output terminals, wherein:
said first and second base regions of the first through n-th differential units are connected to said first and said second amplifier input terminals, respectively, while said first and second base regions of said (n+1)-th differential unit are connected to said first and second amplifier output terminals of the n-th differential amplifier;
said first transistor part comprising:
a first additional transistor which has an emitter region having a predetermined emitter area, a base region connected to said second amplifier input terminal, and a collector region connected in common to the first collector region of said first primary transistor;
said second transistor part comprising:
a second additional transistor having an emitter region which has an emitter area equal to k-times said predetermined emitter area of said first additional transistor and which is coupled in common to the emitter region of said first additional transistor, said second additional transistor having a base region connected in common to said first base region, and a collector region connected in common to said second collector region of said second primary transistor.

4. An intermediate frequency amplification circuit as claimed in claim 2, each of said first through n-th amplifier input terminal pairs consisting of first and second amplifier input terminals while each of the unit input terminal pairs consists of first and second unit input terminals, each of the unit output terminal pairs consisting of first and second unit output terminals, wherein:
said first transistor part comprises:
a plurality of first subsidiary transistors having collector regions connected in common to said first collector region of said first primary transistor, emitter regions having emitter areas substantially equal to that of said first emitter region, and base regions connected in common to said first amplifier input terminal;

said second transistor part comprising:

a plurality of second subsidiary transistors which are equal in number to said first subsidiary transistors and which have collector regions connected in common to the second collector region of said second primary transistor, base regions connected in common to the second base region of said second primary transistor, and emitter regions having emitter areas substantially equal to that of said second emitter region and coupled to the emitter regions of said first subsidiary transistors.

* * * * *

UNITED STATES PATENT AND TRADEMARK OFFICE
CERTIFICATE OF CORRECTION

PATENT NO. : 4,794,342
DATED : December 27, 1988
INVENTOR(S) : Katsuji KIMURA

It is certified that error appears in the above-identified patent and that said Letters Patent is hereby corrected as shown below:

COLUMN 4, LINE 49    Delete "comprise" and insert therefor --comprises--.

COLUMN 7, LINE 47    Delete "$I_{ci1}$" and insert therefor --$\overline{I_{ci1}}$--.

COLUMN 8, LINE 27    Delete "$R_{01}\overline{xI_0}$" and insert therefor --$R_{01}xI_0$--.

COLUMN 8, LINE 51    Delete "$R_{01}I_0$" and insert therefor --$R_{01}\overline{I_0}$--.

COLUMN 10, LINES 51, 52, AND 53    Delete $$"\left(1 + \frac{1 - 1/k}{2\cosh(V_{i-1}/V_T) + k + (1/k)}\right)"$$

and insert therefor $$--\overline{\left(1 + \frac{1 - 1/k}{2\cosh(V_{i-1}/V_T) + k+(1/k)}\right)}--.$$

UNITED STATES PATENT AND TRADEMARK OFFICE
CERTIFICATE OF CORRECTION

PATENT NO. : 4,794,342

DATED : December 27, 1988

INVENTOR(S) : Katsuji KIMURA

It is certified that error appears in the above-identified patent and that said Letters Patent is hereby corrected as shown below:

COLUNM 11, LINE 16  Delete "$R_{01}I_0$," and insert therefor --$R_{01}\overline{I_0}$,--.

COLUMN 13, LINE 26  Delete "$V_{IN} = V1n$" and insert therefor --$V_{IN} = V_T ln$--.

COLUMN 14, LINE 6  Delete "($R_1 I1$" and insert therefor --($R_{11}I_1$--.

COLUMN 14, LINE 39  Delete "$I_0$," and insert therefor --$\overline{I_0}$,--.

Signed and Sealed this

Thirty-first Day of October, 1989

Attest:

DONALD J. QUIGG

Attesting Officer

Commissioner of Patents and Trademarks